US011374603B2

(12) United States Patent
Liu et al.

(10) Patent No.: US 11,374,603 B2
(45) Date of Patent: Jun. 28, 2022

(54) DC-COUPLED SERDES RECEIVER

(71) Applicant: Samsung Electronics Co., Ltd., Suwon-si (KR)

(72) Inventors: Xiong Liu, Cupertino, CA (US); Hiep Pham, San Jose, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/149,597

(22) Filed: Jan. 14, 2021

(65) Prior Publication Data
US 2021/0320679 A1    Oct. 14, 2021

Related U.S. Application Data

(63) Continuation of application No. 15/930,971, filed on May 13, 2020, now Pat. No. 10,897,279.

(60) Provisional application No. 63/008,283, filed on Apr. 10, 2020.

(51) Int. Cl.
| | | |
|---|---|---|
| H04B 3/00 | (2006.01) | |
| H04B 1/16 | (2006.01) | |
| H03H 7/38 | (2006.01) | |
| H02H 9/04 | (2006.01) | |
| H03F 3/45 | (2006.01) | |

(52) U.S. Cl.
CPC .............. *H04B 1/16* (2013.01); *H02H 9/045* (2013.01); *H03F 3/45* (2013.01); *H03H 7/38* (2013.01); *H03F 2200/222* (2013.01); *H03F 2200/231* (2013.01)

(58) Field of Classification Search
CPC . H04B 1/16; H02H 9/045; H03H 7/38; H03F 3/45; H03F 2200/231; H03F 2200/222

USPC ................................ 375/224, 257, 258, 316
See application file for complete search history.

(56) References Cited

U.S. PATENT DOCUMENTS

| | | | |
|---|---|---|---|
| 7,164,299 B2 * | 1/2007 | Nedachi | ............... H03K 17/164 |
| | | | 326/26 |
| 10,270,409 B1 | 4/2019 | Forey et al. | |
| 10,530,325 B1 | 1/2020 | Gonzales et al. | |
| 10,681,802 B1 * | 6/2020 | Beukema | ............ H04L 25/0272 |
| 10,727,895 B1 * | 7/2020 | Nguyen | ................. H04B 1/401 |
| 10,749,552 B2 | 8/2020 | Singh et al. | |
| 10,897,279 B1 * | 1/2021 | Liu | .......................... H04B 3/00 |
| 2006/0171485 A1 | 8/2006 | Laturell et al. | |

(Continued)

FOREIGN PATENT DOCUMENTS

| | | |
|---|---|---|
| KR | 10-1999-0053859 A | 6/2001 |
| KR | 10-2008-0009061 A | 1/2008 |
| KR | 10-1544115 B1 | 8/2015 |

*Primary Examiner* — Don N Vo
(74) *Attorney, Agent, or Firm* — Lewis Roca Rothgerber Christie LLP

(57) ABSTRACT

A receiver includes a first T-coil circuit at an input of the receiver and configured to receive an input signal, a termination impedance coupled to the first T-coil circuit and configured to match an impedance of a transmission line coupled to the first T-coil circuit, and an amplifier including a first input and a second input and configured to amplify a differential signal at the first and second inputs, a calibration switch coupled to the amplifier and configured to selectively electrically connect or disconnect the first and second inputs of the amplifier, and a first receive switch configured to selectively electrically connect or disconnect a center node of the first T-coil circuit and the amplifier.

19 Claims, 9 Drawing Sheets

(56) References Cited

U.S. PATENT DOCUMENTS

| | | |
|---|---|---|
| 2007/0013411 A1* | 1/2007 | Asaduzzaman ...... H03K 17/164 |
| | | 326/83 |
| 2007/0013440 A1 | 1/2007 | Chen et al. |
| 2008/0123771 A1 | 5/2008 | Cranford et al. |
| 2008/0273603 A1* | 11/2008 | Mizutani ............. H04L 25/0292 |
| | | 375/257 |
| 2009/0039916 A1 | 2/2009 | Buchmann et al. |
| 2010/0067154 A1 | 3/2010 | Deng et al. |
| 2012/0249243 A1 | 10/2012 | Rosea |
| 2013/0127526 A1 | 5/2013 | Sayuk |
| 2013/0322512 A1 | 12/2013 | Francese et al. |
| 2014/0368272 A1* | 12/2014 | Wang .................. H03F 3/45071 |
| | | 330/260 |
| 2015/0023398 A1 | 1/2015 | Ren et al. |
| 2017/0019119 A1 | 1/2017 | Mishra et al. |
| 2017/0078084 A1 | 3/2017 | Forey et al. |
| 2017/0187399 A1* | 6/2017 | Hunter ............... H03K 17/6872 |
| 2019/0123551 A1 | 4/2019 | Yuan et al. |

* cited by examiner

DC-COUPLED SERDES RECEIVER

CROSS-REFERENCE TO RELATED APPLICATION(S)

This application is a continuation of U.S. patent application Ser. No. 15/930,971 filed May 13, 2020, now U.S. Pat. No. 10,897,279, which claims priority to, and the benefit of, U.S. Provisional Application No. 63/008,283 ("DC-COUPLED SERDES RECEIVER WITH T-COIL AND AUTO-ZERO SWITCH"), filed on Apr. 10, 2020, the entire contents of which are hereby expressly incorporated herein by reference.

U.S. patent application Ser. No. 15/930,971 is also related to U.S. patent application Ser. No. 15/930,917 entitled "SERDES WITH PIN SHARING", filed on May 13, 2020, which claims priority to and the benefit of U.S. Provisional Patent Application No. 63/008,265 ("SERDES WITH TX AND RX PIN SHARING"), filed on Apr. 10, 2020, the entire contents of which are hereby expressly incorporated by reference.

FIELD

Aspects of embodiments of the present disclosure are generally related to data communication systems.

BACKGROUND

As cellular standards evolve, the data connection speed between the cellular transceiver and the cellular modem is growing ever higher. A traditional parallel connection between transceiver and modem is limited in terms of the speeds to about 2 Gbps per wire. To support a 32 Gbps connection between transceiver and modem, more than 16 wires in one direction may be needed, which translates to utilizing more than 32 wires for establishing bi-directional communication. This presents a major issue in board design as such a large number of high speed wires are difficult to fan out and route onto a space-constrained board. To reduce the number of wires, the parallel interface may be replaced with a high speed Serializer/Deserializer (SERDES).

A SERDES is a functional block that is often used to transmit high speed data across a channel. A SERDES block converts parallel data to serial data and vice versa, and is generally used for transmission of parallel data across a single line or a differential pair to reduce the number of input/output (I/O) pins and interconnects. In high-speed bidirectional communication, each direction utilizes two wires to enable differential signaling, and thus, a minimum of four wires are used.

The above information disclosed in this Background section is only for enhancement of understanding of the present disclosure, and therefore it may contain information that does not form the prior art that is already known to a person of ordinary skill in the art.

SUMMARY

Aspects of embodiments of the present disclosure are directed to a receiver having capable of calibrating the receiver amplifier while maintaining proper input impedance, and having improved input matching and return loss.

According to some embodiments of the present disclosure, there is provided a receiver including: a first T-coil circuit at an input of the receiver and configured to receive an input signal; a termination impedance coupled to the first T-coil circuit and configured to match an impedance of a transmission line coupled to the first T-coil circuit; and an amplifier including a first input and a second input and configured to amplify a differential signal at the first and second inputs; a calibration switch coupled to the amplifier and configured to selectively electrically connect or disconnect the first and second inputs of the amplifier; and a first receive switch configured to selectively electrically connect or disconnect a center node of the first T-coil circuit and the amplifier.

In some embodiments, the first receive switch is configured to electrically connect the first input of the amplifier to the center node of the first T-coil circuit when activated, and to electrically disconnect the first input of the amplifier from the center node of the first T-coil circuit when deactivated.

In some embodiments, the first T-coil circuit includes a first inductor and a second inductor coupled together at the center node.

In some embodiments, the first T-coil circuit has a first end and a second end, the first inductor being coupled between the first end and the center node, the second inductor being coupled between the second end and the center node, the first T-coil circuit being configured to receive the input signal at the first input, and the termination impedance is coupled to the second end of the first T-coil circuit.

In some embodiments, the center node of the first T-coil circuit is coupled to an electrostatic discharge (ESD) protection diode.

In some embodiments, the receiver further includes a controller configured to control activation and deactivation states of the calibration switch and the first receive switch.

In some embodiments, the controller is configured to: identify a mode of the receiver as a calibration mode; and in response to the identification, activate the calibration switch and deactivate the first receive switch.

In some embodiments, the controller is configured to: identify a mode of the receiver as a receive mode; and in response to the identification, deactivate the calibration switch and activate the first receive switch.

In some embodiments, the controller is configured to electrically isolate the amplifier from the first T-coil circuit when the receiver is in a calibration mode.

In some embodiments, the receiver further includes: a second T-coil circuit at the input of the receiver; a second receive switch configured to selectively electrically connect or disconnect the second T-coil circuit and the amplifier.

In some embodiments, the first and second T-coil circuits are configured to receive a differential input signal.

In some embodiments, the amplifier is configured amplify a differential signal output from center nodes of the first and second T-coil circuits when the receiver is in receive mode.

According to some embodiments of the present disclosure, there is provided a receiver including: a pair of T-coil circuits at an input of the receiver and configured to receive an input signal; a termination impedance coupled to the pair of T-coil circuits and configured to match an impedance of a transmission line coupled to the pair of T-coil circuits; and an amplifier including a first input and a second input and configured to amplify a differential signal at the first and second inputs; a calibration switch coupled to the amplifier and configured to selectively electrically connect or disconnect the first and second inputs of the amplifier; and a pair of receive switches configured to selectively electrically connect or disconnect center nodes of the pair of T-coil circuits and the amplifier.

In some embodiments, each T-coil circuit of the pair of T-coil circuits includes a first inductor and a second inductor coupled together at a center node of the center nodes.

In some embodiments, the pair of receive switches are configured to electrically connect the first and second inputs of the amplifier to the center nodes of the pair of T-coil circuits when activated, and to electrically disconnect the first and second inputs of the amplifier from the center nodes of the pair of T-coil circuits when deactivated.

In some embodiments, the receiver further includes a controller configured to electrically connect the amplifier to the pair of T-coil circuits when the receiver is in a receive mode.

In some embodiments, the receiver further includes a controller configured to electrically isolate the amplifier from the pair of T-coil circuits when the receiver is in a calibration mode.

According to some embodiments of the present disclosure, there is provided a method of operating a receiver including: identifying a mode of the receiver as a calibration mode or a receive mode; and in response to identifying the mode as the calibration mode: activating a calibration switch of the receiver to electrically couple inputs of an amplifier of the receiver together to enable measurement of an offset voltage of an amplifier of the receiver; and deactivating a receive switch of the receiver to electrically isolate the amplifier from a T-coil circuit at an input of the receiver, the T-coil circuit being configured to receive an input signal; and in response to identifying the mode as the receive mode: deactivating the calibration switch to electrically decouple inputs of the amplifier; and activating the receive switch to electrically connect the amplifier to center nodes of the T-coil circuit and to enable the amplifier to amplify a signal at an output of the T-coil circuit.

In some embodiments, the receive switch is configured to electrically connect an input of the amplifier to the center node of the T-coil circuit when activated, and to electrically disconnect the input of the amplifier from the center node of the T-coil circuit when deactivated.

In some embodiments, the T-coil circuit includes a first inductor coupled between a first end and a center node, and a second inductor coupled between the center node and a second end, wherein the T-coil circuit is configured to receive the input signal at the first input, and wherein a termination impedance is coupled to the second end of the T-coil circuit.

BRIEF DESCRIPTION OF THE DRAWINGS

The accompanying drawings, together with the specification, illustrate example embodiments of the present disclosure, and, together with the description, serve to explain the principles of the present disclosure.

DETAILED DESCRIPTION

The detailed description set forth below is intended as a description of example embodiments of a receiver and a transceiver and methods of operating the same, provided in accordance with the present disclosure, and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Aspects of the present disclosure are directed to a receiver capable of calibrating the amplifier offset voltage without affecting the input impedance of the receiver and without adversely affecting the transmitter coupled to the receiver through a transmission line. According to some embodiments, the receiver utilizes large, and low on-resistance receive switches in the signal path, which are connected to center nodes of T-coil circuits at input of the receiver, and thus do not affect input impedance of the receiver. The particular configuration of the receiver also improves input matching and reduces (e.g., minimizes) return loss.

Figure 1:
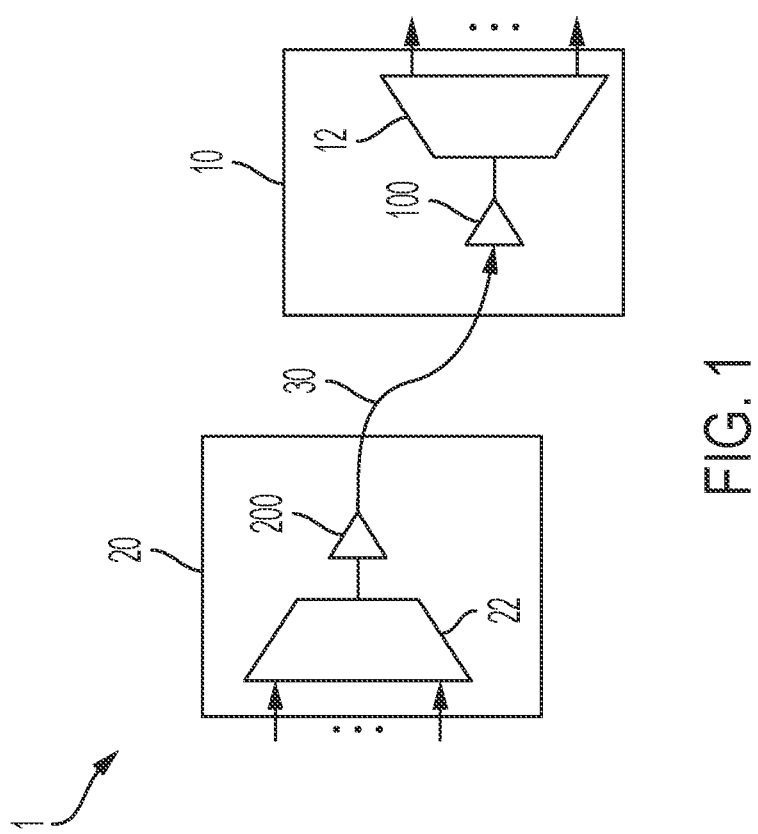
FIG. 1 is a schematic diagram illustrating a data transmission system utilizing a serializer and deserializer (SERDES), according to some embodiments of the present disclosure.

FIG. 1 is a schematic diagram illustrating a data transmission system utilizing a serializer and deserializer (SERDES) 1, according to some embodiments of the present disclosure.

According to some embodiments, the SERDES 1 includes a parallel-in-serial-out (PISO) block 20 (also referred to as a serializer or a parallel-to-serial converter) and a serial-in-parallel-out (SIPO) block (also referred to as a deserializer or serial-to-parallel converter). The PISO block 20 receives parallel data (e.g., high-speed parallel data) from a source (e.g., an external circuit), converts it to serial data (e.g., via a multiplexer/shift-register 22) and transmits the serial data across a transmission line (e.g., a pair of conductors) 30 via a front-end transmitter (henceforth referred to as "transmitter"). The transmission line 30 may be a lossy and noisy channel, and the transmitter may amplify the serial data sufficiently to ensure that the signal can be properly received at the other end of the transmission line. In some examples, the transmission line 30 may be wires/traces in a printed circuit board.

The SIPO block 10 receives and amplifies the attenuated signal from the transmission line 30 via a receiver front-end (henceforth referred to as "receiver"). The received signal may be sampled by a clean clock to reduce (e.g., remove) noise, and the phase of the sampled received signal may be aligned to a well-defined clock phase. The SIPO block 10 then converts the received signal to a parallel digital signal (e.g., via a demultiplexer 12) for further processing by another circuit.

Figure 2A:
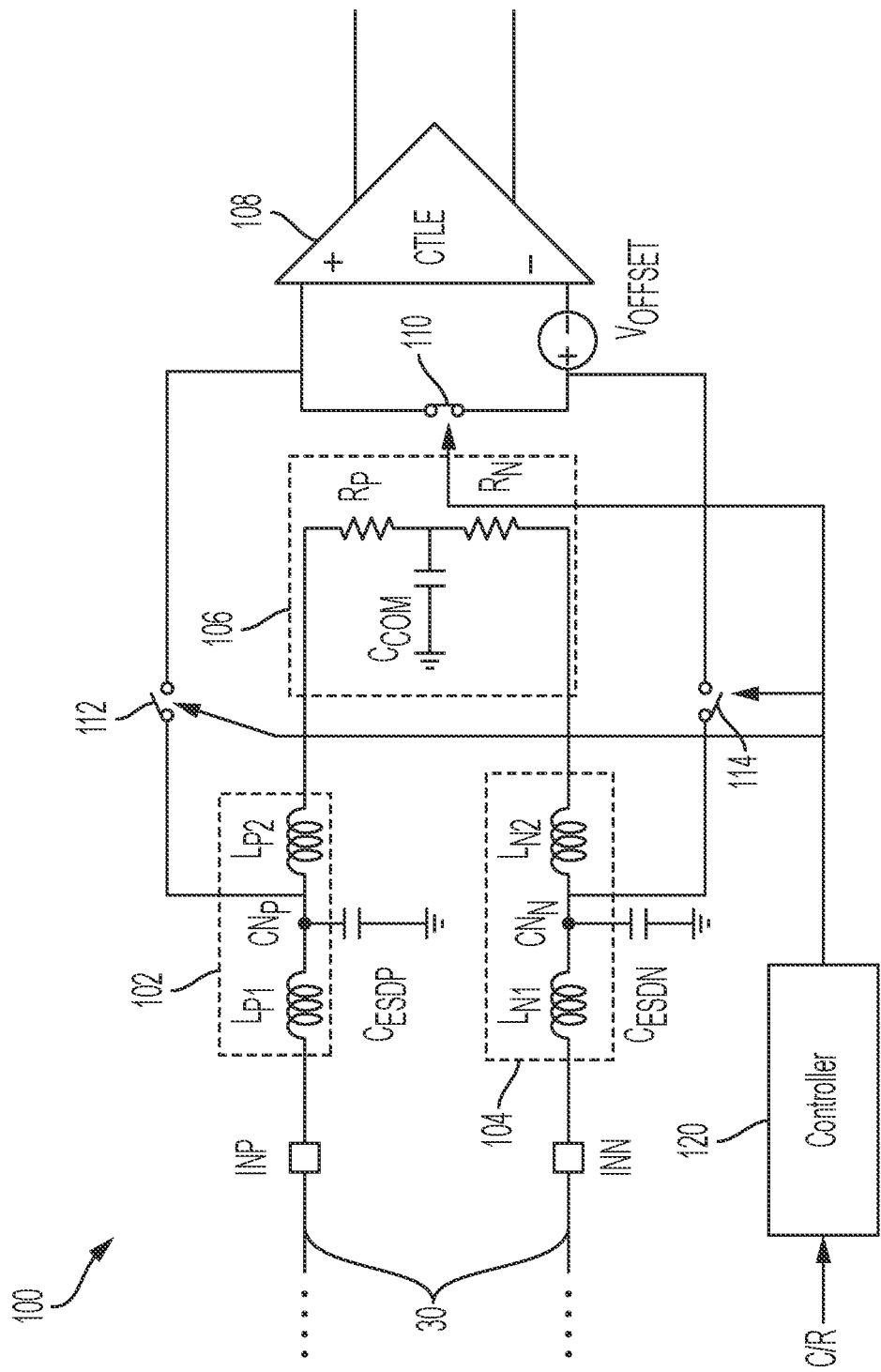
FIG. 2A is a schematic diagram of the receiver, according to some embodiments of the present disclosure.

FIG. 2A is a schematic diagram of the receiver 100, according to some embodiments of the present disclosure.

According to some embodiments, the receiver (e.g., the SERDES receiver) 100 includes a first T-coil circuit 102 and a second T-coil circuit 104 at an input (e.g., at a differential input) of the receiver (INP and INN), a termination impedance 106 coupled to (e.g., fixedly connected) to the first and second T-coil circuits 102 and 104, and an amplifier (e.g., a differential gain amplifier) 108. In some embodiments, the receiver 100 also includes a calibration switch 110 coupled between inputs of the amplifier 108, first and second receive switches (e.g., auto-zero/isolation switches) 112 and 114 for selectively coupling the amplifier 108 to the first and second T-coil circuits 102 and 104, and a controller 120 for controlling the activated and deactivated states of the calibration and receive switches 110, 112, and 114 based on whether the receiver 100 is in a receive mode or a calibration mode.

Each of the first and second T-coil circuits 102 and 104 has a first inductor $L_{P1}/L_{N1}$ coupled between an input and a center node $CN_P/CN_N$, and a second inductor $L_{P2}/L_{N2}$ coupled between the center node $CN_P/CN_N$ and an output. According to some examples, the first and second inductors $L_{P1}$ and $L_{P2}$ may be coupled inductors, and the first and second inductors $L_{N1}$ and $L_{N2}$ may be coupled inductors as well. The inputs of the T-coil circuits 102 and 104 may represent the differential input of the receiver 100 and receive input data via the transmission lines (e.g., the differential transmission lines) 30. In some embodiments, the outputs of the T-coil circuits 102 and 104 are coupled to the termination impedance 106 (e.g., without any switching elements therebetween). The termination impedance 106 is configured to match an impedance of the transmission line 30 coupled to the first T-coil circuits 102 and 140, and may include first and second resistors $R_P$ and $R_N$ coupled to outputs of the first and second T-coil circuits 102 and 104, respectively, and may further include a common capacitor $C_{COM}$ at a connection point between the first and second resistors $R_P$ and $R_N$. The T-coil circuits 102 and 104 together with the terminal impedance 106 have the effect of presenting a 50 ohm impedance to the outside (e.g., to the transmitter 200), extending signal bandwidth, and reducing (e.g., minimizing) signal loss. In some examples, the center nodes of the T-coil circuits 102 and 104 are connect to a pair of large electrostatic discharge (ESD) diodes for ESD protection. The ESD diodes present large parasitic loading to the input, and are represented as parasitic capacitors $C_{ESDP}$ and $C_{ESDN}$. However, a desirable aspect of the T-coil circuits 102 and 104 is that their center node is not sensitive to capacitive loading, and thus the ESD diodes do not meaningfully affect signal bandwidth.

In some examples, the first and second resistors $R_P$ and $R_N$ may be about 50 ohms, the common capacitor $C_{COM}$ may be about 1 pF to about 10 pF (depending on, e.g., whether the common capacitor is implemented on-chip or off-chip), the first and second inductors $L_{P1}/L_{N1}$ and $L_{P2}/L_{N2}$ may be about 50 pH to about 10 nH (depending on, e.g., bandwidth and loading conditions). In some examples, the switches 110, 112, and 112 may be implemented using transistors, for example metal-oxide-field-effect transistors (MOSFETs) such as PMOS or NMOS transistors. However, embodiments of the invention are not limited thereto and said switches may be implemented in any other suitable manner.

According to some examples, the amplifier 108 may be a differential continuous time interval equalizer (CTLE) and is configured to amplify a differential signal at its first and second inputs. The differential nature of the amplifier 108 allows it to reduce (e.g., minimize) common noise such as noise from power supplies. Thus, the positive branch and negative branch of the receiver 100 may be symmetrical. For example, the first T-coil circuit 102 may be the same as the second T-coil circuit 104 and the first and second resistors $R_P$ and $R_N$ may be the same.

The amplifier 108 may be the first gain block in a larger circuit at the receiver 100. As such, it is desirable to reduce (e.g., minimize) any input referred offset voltage $V_{OFFSET}$ as the offset may be amplified by the amplifier 108 and subsequent blocks and cause system errors. The input referred offset voltage $V_{OFFSET}$ may result from various mismatches, such as device characteristic mismatch due to layout parasitic effect, uneven doping, lithographic mismatch, and/or the like. The offset voltage $V_{OFFSET}$ may range from several mV to tens of mV. The offset voltage $V_{OFFSET}$ is illustrated as a voltage source at one of the amplifier 108 inputs in FIG. 2.

In some examples, the offset voltage $V_{OFFSET}$ may be corrected by using an auto-zero technique or offset cancellation. However, both approaches involve electrically shorting the two inputs of the amplifier 108. In some embodiments, the receiver 100 calibrates the offset voltage of the amplifier 108 when in calibration mode.

Figure 2B:
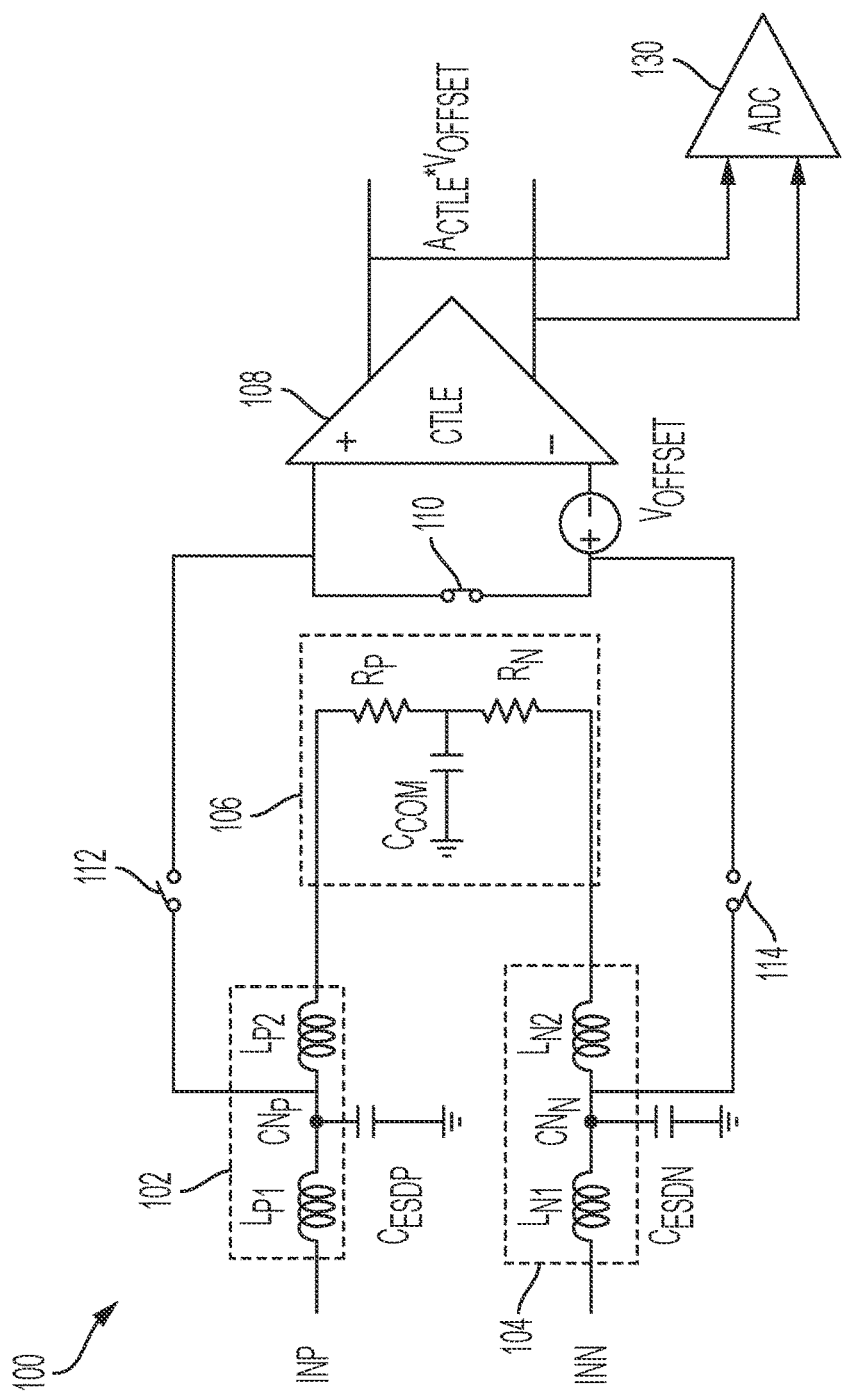
FIG. 2B is a schematic diagram of the receiver when in calibration mode, according to some embodiments of the present disclosure.

FIG. 2B is a schematic diagram of the receiver 100 when in calibration mode, according to some embodiments of the present disclosure.

In some embodiments, when the controller 120 identifies the mode as the calibration mode (e.g., via a calibrate/receive signal C/R from an external source), the controller activates (e.g., closes) the calibration switch 110 to electrically short the inputs of the amplifier 108 (i.e., the two inputs of the amplifier 108 will be at the same voltage). As the differential input of the amplifier 108 is effectively zero in this mode, the amplifier output is the offset voltage $V_{OFFSET}$ multiplied by the amplifier gain $A_{CTLE}$. In some examples, this output voltage is digitized by an analog-to-digital converter (ADC) 130 or stored in a capacitor for digital or analog offset cancellation. As the amplifier gain $A_{CTLE}$ is a known value, the input referred offset voltage $V_{OFFSET}$ can readily be determined based on the output voltage of the amplifier 108 during calibration.

According to some embodiments, when in calibration mode, the controller 120 deactivates (e.g., opens) the receive switches 112 and 114 to electrically isolate the amplifier from the T-coil circuits 102 and 104, and thus electrically isolate (e.g., electrically disconnect) the amplifier 108 from the input of the receiver 100. As such, the shorting of the amplifier inputs by the calibration switch does not lead to the shorting of the receiver inputs INN and INP, which may cause the outputs of the transmitter 200 to electrically short and lead to disastrous results. As the termination impedance 106 is coupled to the input of the receiver 100 irrespective of the mode of operation, even when the receiver 100 is being calibrated, the transmitter 200 at the other side of the transmission line still observes a properly input-matched receiver (e.g., a 50 ohm resistance).

In some examples, to prevent an unintended fighting of the transmitter output with shorted receiver inputs, the controller deactivates the first and second receive switches 112 and 114 before activating the calibration switch 110;

however, embodiments of the present invention are not limited thereto, and the controller may affect the states of the switches 110, 112, and 114 in any suitable order.

Given that the calibration switch 110 is not in a high-speed signal path or a large current path when in calibration mode, the size of the calibration switch 110 may be reduced (e.g., minimized) as appropriate to reduce the parasitic loading on the amplifier inputs.

According to some embodiments, the receiver 100 enters calibration mode when initially powering up and before beginning normal transmission operation. However, calibration may also be performed at regular intervals or in response to particular conditions, such as power supply disruptions, etc.

When not in calibration mode, the receiver 100 operates in receive mode (e.g., mission or normal operation mode), and the controller adjusts the states of the switches 110, 112, and 114 accordingly.

Figure 2C:
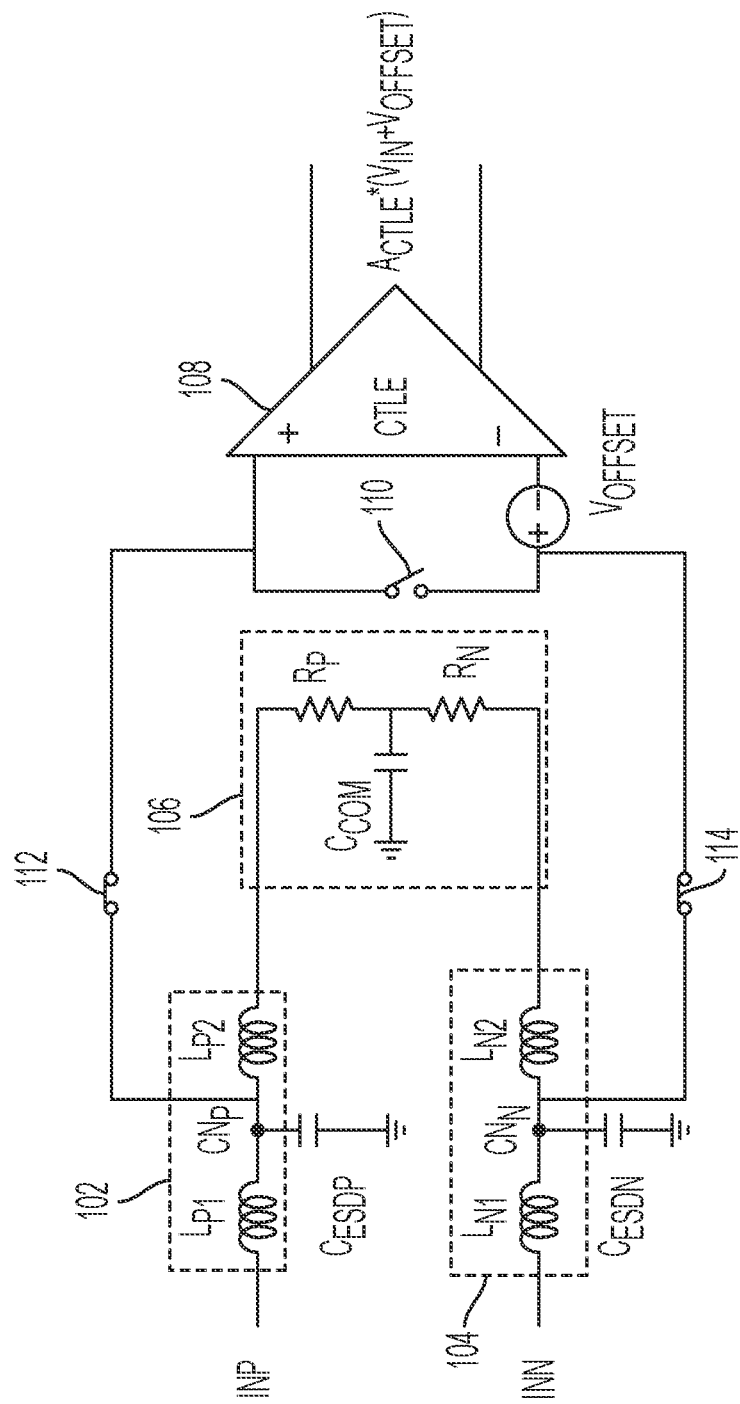
FIG. 2C is a schematic diagram of the receiver when in receive mode, according to some embodiments of the present disclosure.

FIG. 2C is a schematic diagram of the receiver 100 when in receive mode, according to some embodiments of the present disclosure.

In some embodiments, when the controller 120 identifies the mode as the receive mode (e.g., via a calibrate/receive signal C/R from an external source), the controller deactivates (e.g., opens) the calibration switch 110 to disconnect the inputs of the amplifier 108, and activates the first and second receive switches 112 and 114 to electrically couple the inputs of the amplifier 108 to the first and second T-coil circuits 102 and 104 and allow the input signal at the receiver input to reach the amplifier 108. As the first and second receive switches 112 and 114 are in the signal path from the receiver input to the amplifier 108, it is desirable to reduce (e.g., minimize) their on-resistance in order to reduce signal attenuation and reduce any adverse effects on input impedance of the receiver 100. Thus, in some embodiments, the receiver 100 utilizes large switches for the first and second receive switches 112 and 114 to reduce (e.g., minimize) on-resistance in the signal path and improve (e.g., increase) bandwidth during receive mode. As a result, the signal received by the inputs of the amplifier 108 in receive mode may be approximately the input signal $V_{IN}$ and the output of the amplifier 108 may be approximately the amplified input signal plus offset voltage (i.e., approximately $A_{CTLE} \times (V_{IN} + V_{OFFSET})$).

One side effect of using large switches as the receive switches 112 and 114 is they may also produce large capacitive loading. However, as the center node of a T-coil circuit is not sensitive to capacitive loading, the input impedance of the T-coil circuits is effectively unchanged as a result of the receive switches 112 and 114 closing, and the effective bandwidth of the receiver input may be largely unaffected by the activated/deactivated states of the receive switches 112 and 114.

As described herein, receiver 100 according to some embodiments of the present disclosure allows for calibration of the amplifier offset voltage without affecting the input impedance of the receiver and adversely affecting the transmitter coupled to the receiver through a transmission line. According to some embodiments, the receive switches, which are in a signal path during the receive mode are large and have low on-resistance. Because the switches are connected to center nodes of T-coil circuits at the input of the receiver, which are not sensitive to parasitic capacitor loading, the relatively large parasitic capacitance of the switches (due to their large size) does not affect signal bandwidth. Connecting the receive switches to the center node of the T-coil circuits allows the receiver to present an almost purely resistive input impedance (e.g., about 50 ohms), which improves input matching and reduces (e.g., minimizes) return loss.

Aspects of the receiver 100 may be utilized to construct a transceiver (e.g., a SERDES transceiver) capable of pin-sharing to reduce (e.g., minimize) pin count.

Figure 3A:
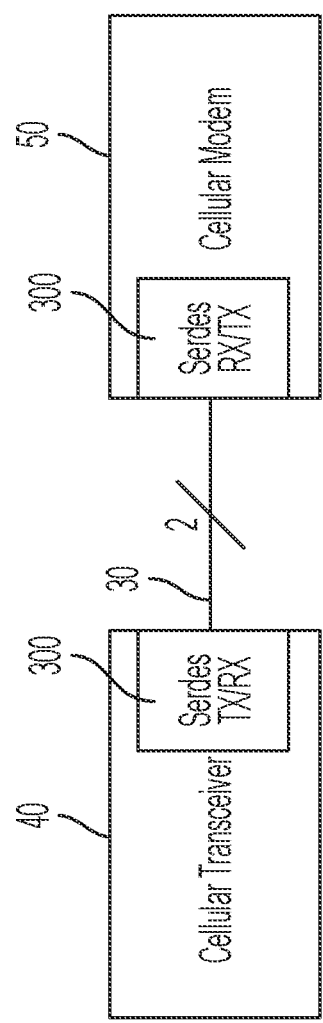
FIG. 3A is a schematic diagram of a half-duplex system with two communication modules utilizing transceivers to engage in bidirectional communication, according to some embodiments of the present disclosure.
Figure 3B:
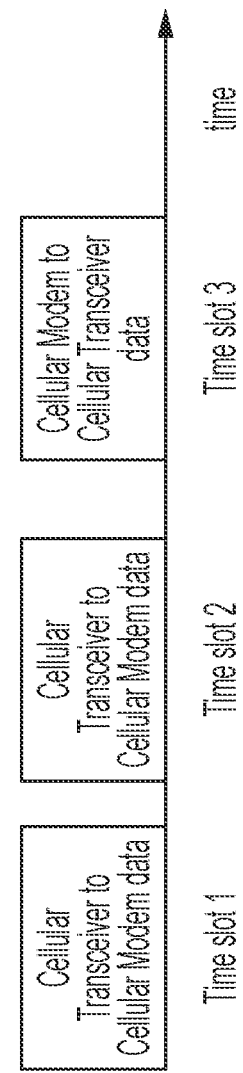
FIG. 3B illustrates an example of time-division duplexing over the half duplex communication link of FIG. 1.

FIG. 3A is a schematic diagram of a half-duplex system with two communication modules 40 and 50 utilizing transceivers 300 to engage in bidirectional communication, according to some embodiments of the present disclosure. FIG. 3B illustrates an example of time-division duplexing over the half duplex communication link of FIG. 1.

In the related art, a communication module engaged in high-speed bi-directional communication uses at least four pins, that is, at least two pins for transmitting a differential signal and at least two pins for receiving a differential signal.

According to some embodiments, the transceiver (e.g., the SERDES transceiver) 300 is capable of facilitating high-speed bidirectional communication with two pins. Thus, in the half-duplex system of FIG. 5, a first communication module (e.g., a cellular transceiver block) 40 and a second communication module (e.g., a cellular modem block) 50, which utilize the transceiver 300, may engage in bi-directional differential signaling with only two pins each. The two pins on each side transmit a differential signal to, or receive a differential signal from, a pair of conductors 30 (e.g., wires, interconnects, traces, etc.) carrying a pair or complimentary signals (e.g., a differential signal) that aid to reduce/minimize common mode noise. According to some embodiments, the transceiver 300 achieves pin sharing by adopting a time division duplex approach, as shown in FIG. 3B. In the example of FIG. 3B, the first and second communication modules have coordinated to have the pair of conductor 30 carry a differential signal from the first communication module 40 to the second communication module 50 during a first and second time slot, and to carry a differential signal from the second communication module 50 to the first communication module 40 during a third time slot. However, embodiments of the present invention are not limited thereto. For example, the first and second communication modules 40 and 50 may have predefined pattern of time slots, or one the modules 40/50 may act as a master module and dynamically change the time share pattern depending on usage.

Figure 4:
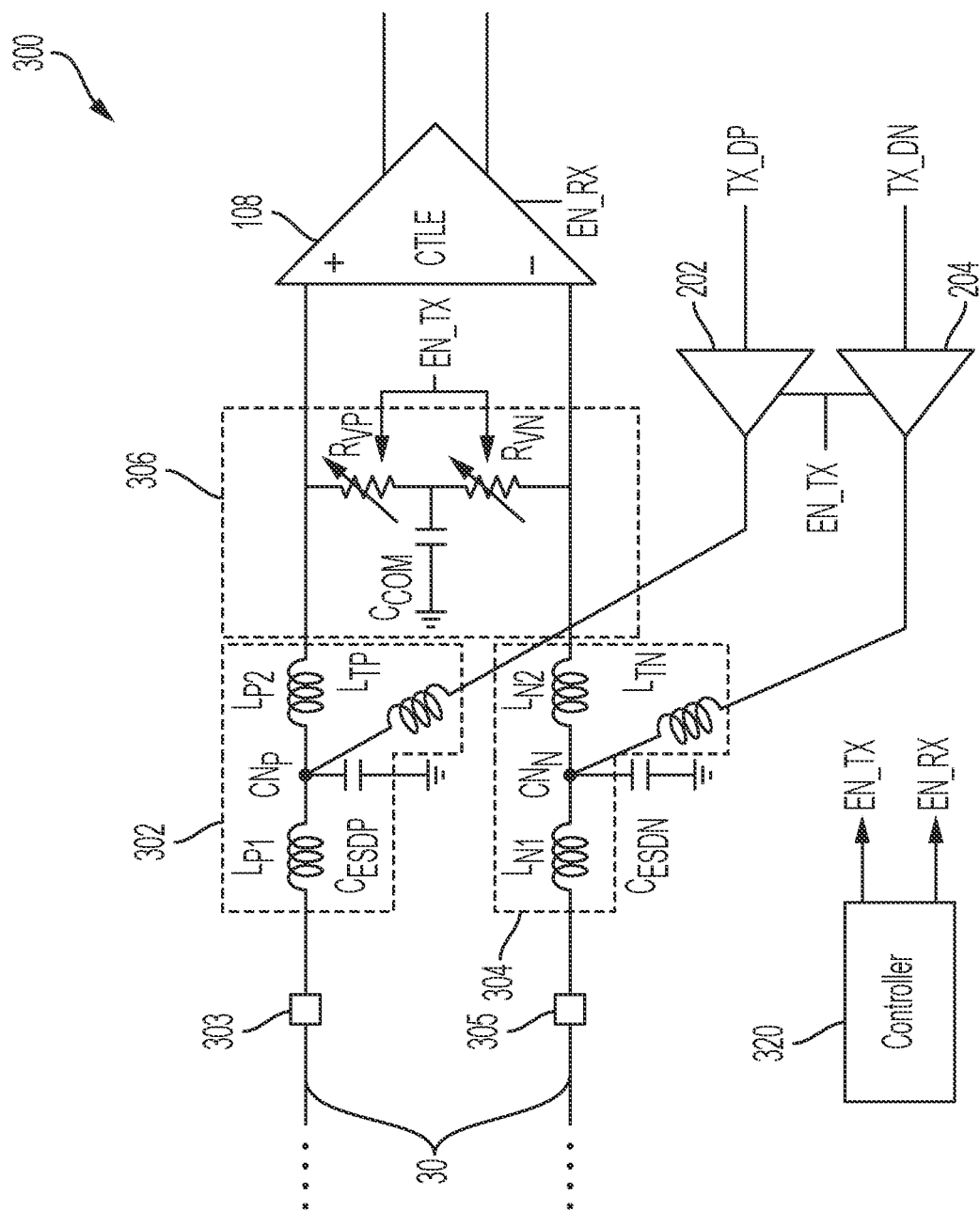
FIG. 4 is a schematic diagram of the transceiver, according to some embodiments of the present disclosure.

FIG. 4 is a schematic diagram of the transceiver 300, according to some embodiments of the present disclosure.

Referring to FIG. 6, in some embodiments, the transceiver 300 includes a first common T-coil circuit 302 and a second common T-coil circuits 304 coupled to the first and second input-output pins (also referred to as the first and second shared/common input-output pins) 303 and 305 of the transceiver; a termination impedance (e.g., a variable termination impedance) 306 coupled to the first and second common T-coil circuits 302 and 304; an amplifier 108, which is configured to receive an input signal (e.g., a differential input signal) from the input-output pins 303 and 305 through the common T-coil circuits 302 and 304; and first and second transmission buffers 202 and 204, which are configured to transmit an output signal (e.g., a differential output signal) to the input-output pins 303 and 305 through the common T-coil circuits 302 and 304.

According to some embodiments, each common T-coil circuit 302/304 includes a first inductor $L_{P1}/L_{N1}$ coupled between the transmission line 30 and a center node $CN_P/CN_N$, a second inductor $L_{P2}/L_{N2}$ coupled between the termination impedance 306 and the center node $CN_P/CN_N$, and a third inductor $L_{TP}/L_{TN}$ coupled between a corresponding transmission buffer 202/204 and the center node $CN_P/CN_N$. According to some examples, the first, second and third inductors $L_{P1}$, $L_{P2}$, and $L_{TP}$ may be coupled inductors, and the first, second and third inductors $L_{N1}$, $L_{N2}$, and $L_{TN}$ may be coupled inductors as well. In some examples, the center nodes $CN_P$ and $CN_N$ of the common T-coil circuits 302 and 304 are connect to a pair of large electrostatic discharge (ESD) diodes ($C_{ESDP}$ and $C_{ESDPN}$) for ESD protection.

The termination impedance 306 is configured to match or substantially match the impedance of the transmission line 30 that is coupled to the common T-coil circuits 302 and 304 when the transceiver is operating in receive mode. In some embodiments, the termination impedance 306 includes first and second variable resistors $R_P$ and $R_N$ coupled to the first and second common T-coil circuits, and further includes a common capacitor $C_{COM}$ coupled between the variable resistors $R_{VP}$ and $R_{VN}$. The variable resistors $R_P$ and $R_N$ are configured to change their resistance based on the operational mode of the transceiver 300.

The first and second transmission buffers 202 and 204 may be tri-state buffers that can transmit the output signal (TX_DP and TX_DN) to the input-output pins 303 and 305 when the transceiver 300 is enabled during a transmit mode a produced a high-impedance output when the transceiver 300 is disabled during a receive mode.

According to some embodiments, when the controller 320 identifies the operational mode of the transceiver 300 as a receive mode, the controller 320 generate a transmit disable signal (e.g., EN_TX=logic low 'L') to disable the first and second transmission buffers 202 and 204 and place them in a high-impedance state. This prevents any transmit signal from being fed back to the amplifier 108. In this mode, the controller 320 also sets the values of the variable resistors $R_{VP}$ and $R_{VN}$ to a value matching or substantially matching the impedance of the transmission line 30 (e.g., 50 ohms). As no signal passes through the third inductor $L_{TP}$ in the receive mode, the common T-coil circuits 302 and 304 effectively function as the two-inductor peaking circuits of T-coil circuits 102 and 104, and together with the terminal impedance 306 have the effect of presenting a 50 ohm impedance to the outside (e.g., to the transmitter 200), extending signal bandwidth, and reducing (e.g., minimizing) signal loss. In this mode, the controller 320 also generates a receive enable signal (e.g., EN_RX=logic high 'H') to enable the amplifier 108 and to allow it to receive and amplify the input signal for further processing by circuits downstream.

According to some embodiments, when the controller 320 identifies the operational mode of the transceiver 300 as a transmit mode, the controller 320 generate a transmit enable signal (e.g., EN_TX=logic high 'H') to enable the first and second transmission buffers 202 and 204 to transmit the output signal (TX_DP and TX_DN) to the input-output pins 303. The controller 320 also generate a receive disable signal (e.g., EN_RX=logic low 'L') to disable the amplifier 108, thus preventing it from amplifying any transmit signal. In this mode, the controller 320 also sets the values of the variable resistors $R_{VP}$ and $R_{VN}$ to a high-impedance value (e.g., about 10000 ohms) to significantly reduce or eliminate any signal passing through the second inductor $L_{P2}$. Thus, again, the common T-coil circuits 302 and 304 effectively function as the two-inductor peaking circuits of T-coil circuits 102 and 104 (with the first and third inductors $L_{P2}$ and $L_{TP}$ conducting a signal), and improve the transmission bandwidth.

As shown in FIG. 4, in some embodiments, the amplifier 108 is fixedly coupled to the termination impedance 106 and the first and second common T-coil circuits 302 and 304. However, embodiments of the present invention are not limited thereto. For example, when it is desirable to calibrate the offset voltage of the amplifier 108 (e.g., when communicating over a long transmission line 30 and where input signal is small), a calibration switch may be used to selectively short the inputs of the amplifier 108 and auto-zero switches may be positioned in the signal path of the receive signal and deactivated, in calibration mode, to electrically isolate the amplifier from the input-output pins 303 and 305.

Figure 5:
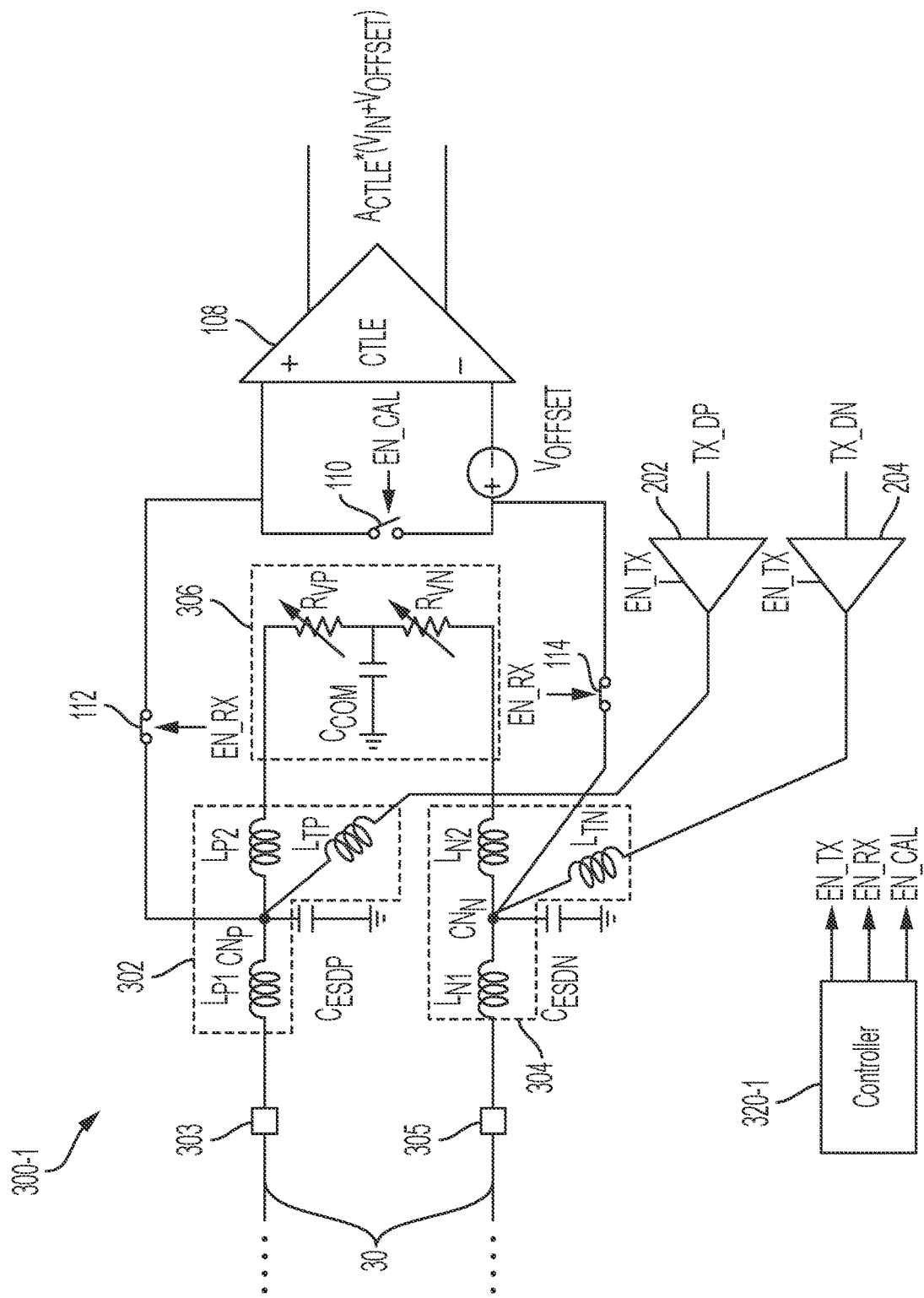
FIG. 5 is a schematic diagram of the transceiver capable of calibration, according to some embodiments of the present disclosure.

FIG. 5 is a schematic diagram of the transceiver 300-1 capable of calibration, according to some embodiments of the present disclosure.

Referring to FIG. 5, the transmit side of the transceiver 300-1 is substantially the same as the transmit side of the transceiver 300, while the receive side of the transceiver 300-1 is substantially the same as the receiver 100, with the exception of the terminal impedance 306 with variable resistors. Further, the controller 320-1 is substantially the same as the controller 320, except that it also generate calibration enable/disable signals. As such, a description of the circuit elements of the transceiver 300 will not be repeated here.

According to some embodiments, the controller 320-1 is configured to identify the operational mode of the transceiver 300-1 as either a calibration mode, a transmit mode, or a receive mode.

In some embodiments, in the calibration mode, the controller 320-1 generates a receive disable signal to electrically decouple (e.g., electrically isolate) the amplifier 108 from the first and second common T-coil circuits 302 and 304. The controller 320-1 also generates a transmit disable signal (e.g., EN_TX=logic low 'L') to disable the first and second transmission buffers 202 and 204, and to set the variable resistors $R_{VP}$ and $R_{VN}$ of the terminal impedance 306 to a first resistance value (e.g., about 50 ohms). In the calibration mode, the controller 320-1 generates a calibration enable signal (e.g., EN_CAL=logic high 'H') to activate the calibration switch 110 and to short the two inputs of the amplifier 108. This may allow other circuits to measure and calibrate the offset voltage $V_{OFFSET}$ of the amplifier (as, e.g., described above with reference to FIGS. 2A-2C).

According to some embodiments, in the receive mode, the controller 320-1 generates the receive enable signal to electrically couple the amplifier 108 to the center nodes $CN_P$ and $CN_N$ of the first and second common T-coil circuits 302 and 304 to enable the amplifier 108 to receive the input signal from the input-output pins 303 and 305. The controller 320-1 also generates a transmit disable signal to disable the first and second transmission buffers 202 and 204, and to set the variable resistors $R_{VP}$ and $R_{VN}$ of the terminal impedance 306 to a first resistance value (e.g., about 50 ohms). In the receive mode, the controller 320-1 also generates a calibration disable signal to deactivate the calibration switch 110.

In some embodiments, in the transmit mode, the controller 320-1 generates a receive disable signal to electrically decouple (e.g., electrically isolate) the amplifier 108 from the first and second common T-coil circuits 302 and 304. The controller 320-1 may also generate a calibration disable signal to deactivate the calibration switch 110. In the transmit mode, the controller 320-1 generates the transmit enable signal to enable the first and second transmission buffers 202 and 204 to transmit the output signal (TX_DP and TX_DN) to the input-output pins 303 and 305, and to set the variable resistors $R_{VP}$ and $R_{VN}$ of the terminal impedance 306 to a second resistance value (e.g., about 10000 ohms).

Figure 6A:
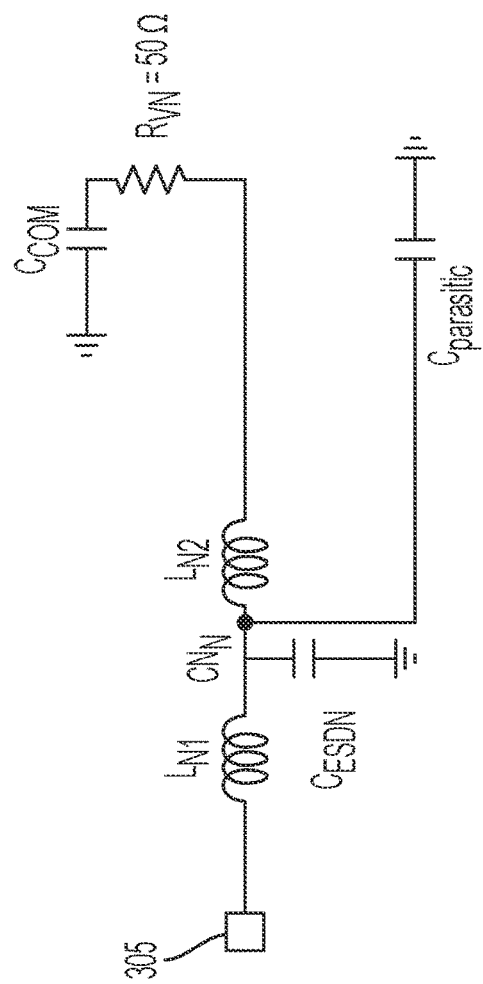
FIG. 6A illustrates a half-circuit of the transceiver while in the calibration and receive modes, according to some embodiments of the present disclosure.

FIG. 6A illustrates a half-circuit of the effective peaking structure of the transceiver 300/300-1 while in the calibration and receive modes, according to some embodiments of the present disclosure. In these modes, each disabled transmission buffer 202/204 enters a high-impedance state and effectively appears as a parasitic capacitance $C_{parasitic}$ coupled to the corresponding center node $CN_P/CN_N$. However, as described above with reference to FIGS. 2A-2C, because the center node $CN_P/CN_N$ of the common T-coil circuit 302/304 is not sensitive to capacitive loading, this parasitic capacitance $C_{parasitic}$ does not affect the bandwidth of transceiver 300/300-1 when receiving an input signal.

Figure 6B:
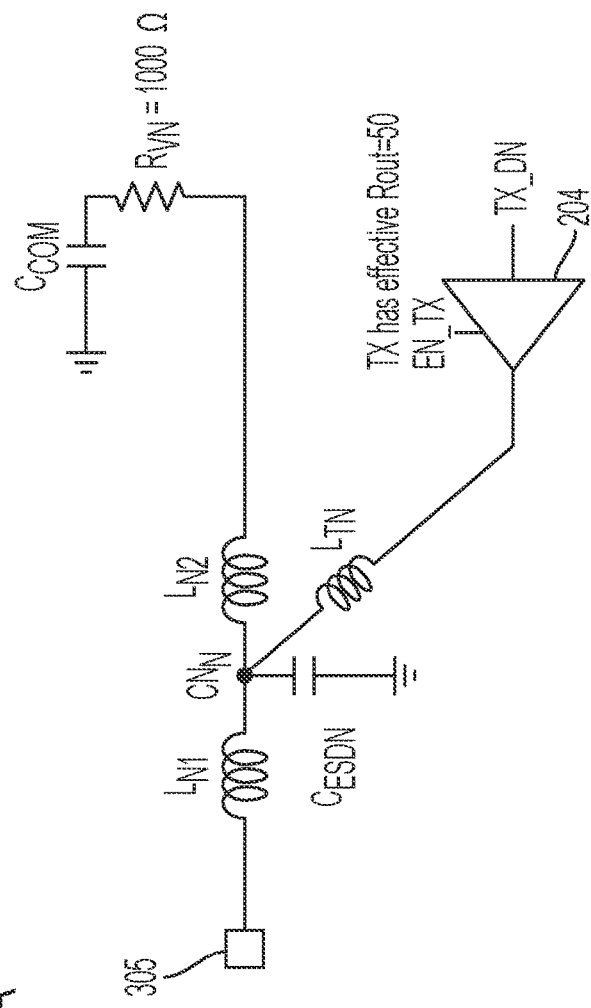
FIG. 6B illustrates a half-circuit of the transceiver while in the transmit mode, according to some embodiments of the present disclosure.

FIG. 6B illustrates a half-circuit of the effective peaking structure of the transceiver 300/300-1 while in the transmit mode, according to some embodiments of the present disclosure. In this mode, the enabled transmission buffer 202/204 may have an effective output impedance that matches the impedance of the transmission line 30 (e.g., about 50 ohms). Further, as the variable resistor $R_{VP}/R_{VN}$ is set to a high resistance (e.g., 1000 ohms), the path through the second inductor $L_{N2}$ does not conduct any meaningful amount of signal, and the common T-coil circuit 302/304 effectively functions as a 2-inductor peaking T-coil circuit (with the first and third inductors $L_{N1}$ and $L_{TN}$) similar to the T-coil circuit 102/104.

Figure 7:
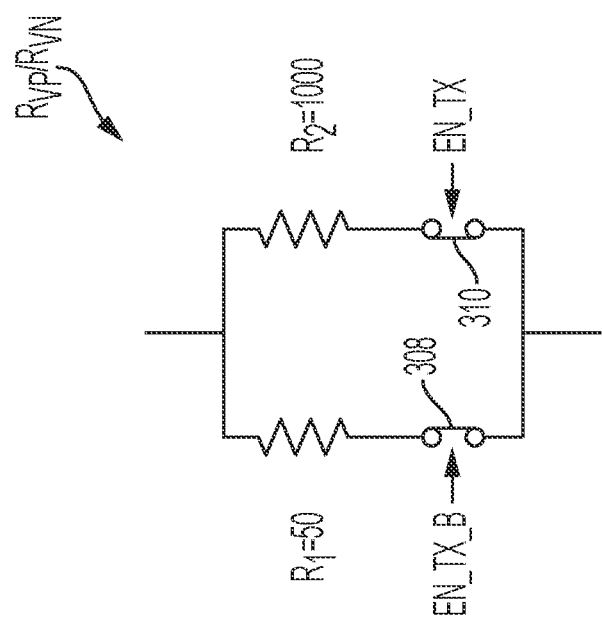
FIG. 7 is a schematic diagram illustrating the variable resistor, according to some embodiments of the present disclosure.

FIG. 7 is a schematic diagram illustrating the variable resistor $R_{VP}/R_{VN}$, according to some embodiments of the present disclosure.

Referring to FIG. 7, the variable resistor $R_{VP}/R_{VN}$ may be implemented with switchable elements. In some embodiments, the variable resistor $R_{VP}/R_{VN}$ has a first branch (e.g., a first switchable branch) in parallel with a second branch (e.g., a second switchable branch) each with a different resistance. The first branch includes a first resistor $R_1$ coupled in series with a first switch 308 that is configured to activate in response to a transmit disable signal (e.g., EN_TX_B=Logic high 'H'), and the second branch includes a second resistor $R_2$ coupled in series with a second switch 310 that is configured to activate in response to the transmit enable signal (e.g., EN_TX=logic high 'H'), Thus, at any given time, either the first branch is active or the second branch, but not both.

While the receiver 100 and the transceiver 300/300-1 have been described herein with reference to a SERDES block, embodiments of the present application are not limited thereto, and the receiver 100 and the transceiver 300/300-1 may be used in any suitable application, such as non-return-to-zero (NRZ) and pulse-amplitude modulation 4-Level (PAM4) signaling methods.

As described herein, transceiver 300/300-1 according to some embodiments of the present disclosure allows for transmit and receive front-end circuits to share input/output pins, thus saving chip pin count and reducing the number of wires/traces that are routed. Further, the transceiver 300/300-1 according to some embodiments of the present disclosure allows for transmit and receive front-end circuits to share a pair of T-coil circuits (rather than use two separate pairs of T-coils), thus saving area (e.g., printed circuit board area). In some embodiments, the transceiver 300/300-1 allows for the calibration of receiver-end amplifier by using switches to isolate the amplifier from the rest of the circuit while in calibration or transmit mode. This makes the transceiver 300/300-1 suitable for long-range and small-input signal communication. The isolating switches are large and have low on-resistance, and their parasitic loading is masked by virtue of being connected to the center nodes of the T-coil circuits. As such, the presence of large isolation switches does not affect signal bandwidth. Furthermore, regardless of the mode of operation (e.g., calibration, receive, or transmit), the input to the transceiver sees a 50 ohm termination (i.e., with limited to no parasitic loading from switches), which allows the transceiver 300/300-1 to provide improved input matching and return loss.

For simplicity of description, in the above, it is assumed herein that various components of the receiver 100 and the transceivers 300 and 300-1 are activated (e.g., enabled/turned on or closed) by a logic high signal (e.g., a binary '1') and deactivated (e.g., disabled/turned off or opened) by a logic low signal (e.g., a binary '0'). However, embodiments of the present application are not limited thereto, and one or more components of the receiver 100 and the transceivers 300 and 300-1 may be activated (e.g., enabled/turned on or closed) by a logic low signal (e.g., a binary '0') and deactivated (e.g., disabled/turned off or opened) by a logic high signal (e.g., a binary '1').

As understood by a person of ordinary skill in the art, the operations performed by the controller 120/320/320-1 may be performed by a processor. A memory local to the processor may have instructions that, when executed, cause the processor to perform the controller's operations.

It will be understood that, although the terms "first", "second", "third", etc., may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section, without departing from the scope of the inventive concept.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include", "including", "comprises", and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of", when preceding a list of elements, modify the entire list of elements and do not modify the individual elements of the list. Further, the use of "may" when describing embodiments of the inventive concept refers to "one or more embodiments of the inventive concept". Also, the term "exemplary" is intended to refer to an example or illustration.

As used herein, the terms "use", "using", and "used" may be considered synonymous with the terms "utilize", "utilizing", and "utilized", respectively.

The receiver, the transceiver and/or any other relevant devices or components according to embodiments of the present disclosure described herein, such as the controller, may be implemented by utilizing any suitable hardware, firmware (e.g., an application-specific integrated circuit), software, or any suitable combination of software, firmware, and hardware. For example, the various components of the receiver and transceiver may be formed on one integrated circuit (IC) chip or on separate IC chips. Further, the various components of the receiver and transceiver may be implemented on a flexible printed circuit film, a tape carrier package (TCP), a printed circuit board (PCB), or formed on the same substrate. Further, the various components of the receiver and transceiver may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer-readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present disclosure.

While this disclosure has been described in detail with particular references to illustrative embodiments thereof, the embodiments described herein are not intended to be exhaustive or to limit the scope of the disclosure to the exact forms disclosed. Persons skilled in the art and technology to which this disclosure pertains will appreciate that alterations and changes in the described structures and methods of assembly and operation can be practiced without meaningfully departing from the principles, and scope of this disclosure, as set forth in the following claims and equivalents thereof.

What is claimed is:

1. A receiver comprising:
   a first T-coil circuit at an input of the receiver and configured to receive an input signal, the first T-coil circuit comprising a first inductor and a second inductor coupled together at a center node;
   a termination impedance coupled to the first T-coil circuit and configured to match an impedance of a transmission line coupled to the first T-coil circuit; and
   an amplifier comprising a first input and a second input and configured to amplify a differential signal at the first and second inputs, the first input being coupled to the center node.

2. The receiver of claim 1, wherein the first T-coil circuit has a first end and a second end, the first inductor being coupled between the first end and the center node, the second inductor being coupled between the second end and the center node, the first T-coil circuit being configured to receive the input signal at the first input, and
   wherein the termination impedance is coupled to the second end of the first T-coil circuit.

3. The receiver of claim 1, wherein the center node of the first T-coil circuit is coupled to an electrostatic discharge (ESD) protection diode.

4. The receiver of claim 1, further comprising:
   a calibration switch coupled to the amplifier and configured to selectively electrically connect or disconnect the first and second inputs of the amplifier; and
   a first receive switch configured to selectively electrically connect or disconnect a center node of the first T-coil circuit and the amplifier.

5. The receiver of claim 4, wherein the first receive switch is configured to electrically connect the first input of the amplifier to the center node of the first T-coil circuit when activated, and to electrically disconnect the first input of the amplifier from the center node of the first T-coil circuit when deactivated.

6. The receiver of claim 4, further comprising a controller configured to control activation and deactivation states of the calibration switch and the first receive switch.

7. The receiver of claim 6, wherein the controller is configured to:
   identify a mode of the receiver as a calibration mode; and
   in response to the identification, activate the calibration switch and deactivate the first receive switch.

8. The receiver of claim 6, wherein the controller is configured to:
   identify a mode of the receiver as a receive mode; and
   in response to the identification, deactivate the calibration switch and activate the first receive switch.

9. The receiver of claim 6, wherein the controller is configured to electrically isolate the amplifier from the first T-coil circuit when the receiver is in a calibration mode.

10. The receiver of claim 1, further comprising:
    a second T-coil circuit at the input of the receiver,
    wherein the first and second T-coil circuits are configured to receive a differential input signal.

11. The receiver of claim 10, further comprising:
    a second receive switch configured to selectively electrically connect or disconnect the second T-coil circuit and the amplifier.

12. The receiver of claim 10, wherein the amplifier is configured amplify a differential signal output from center nodes of the first and second T-coil circuits when the receiver is in receive mode.

13. A transmitter comprising:
    a first T-coil circuit at a first output of the transmitter and configured to transmit an output signal, the first T-coil circuit comprising a first inductor, a second inductor, and a third inductor coupled together at the center node, the center node being coupled to an electrostatic discharge (ESD) protection diode;
    a first transmission buffer coupled to the second inductor and configured to generate a first output signal for transmission through the first T-coil circuit; and
    a termination impedance coupled to the third inductor and configured to match an impedance of a transmission line coupled to the first T-coil circuit.

14. The transmitter of claim 13, further comprising:
    a second T-coil circuit at a second output of the transmitter; and
    a second transmission buffer coupled to the second T-coil circuit and configured to generate a second output signal for transmission through the second T-coil circuit.

15. The transmitter of claim 14, wherein the first and second T-coil circuits are configured to transmit a differential output signal,
    wherein the differential output signal is a difference between the first and second output signals.

16. The transmitter of claim 13, wherein the first T-coil circuit has a first end and a second end, the first inductor being coupled between the first end and the center node, the second inductor being coupled between the second end and the center node, the first T-coil circuit being configured to transmit the first output signal at the first end.

17. The transmitter of claim 13, wherein the first transmission buffer includes a tri-state buffer.

18. The transmitter of claim 13, wherein the first transmission buffer is configured to enter a high-impedance stated in response to a transmit disable signal, and to transmit the first output signal in response to a transmit enable signal.

19. The transmitter of claim 13, further comprising a controller configured to control activation and deactivation states of the first transmission buffer.

* * * * *